United States Patent
Becker et al.

(10) Patent No.: US 7,148,785 B2
(45) Date of Patent: Dec. 12, 2006

(54) CIRCUIT PROTECTION DEVICE

(75) Inventors: Paul N. Becker, San Carlos, CA (US); Sirikhit Maniraj, East Palo Alto, CA (US); Martin Pineda, Fremont, CA (US); Anthony Vranicar, Santa Clara, CA (US); Francis M. Yankello, Union City, CA (US); Frank Wasilewski, Redwood City, CA (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 10/835,655

(22) Filed: Apr. 30, 2004

(65) Prior Publication Data

US 2004/0218329 A1    Nov. 4, 2004

Related U.S. Application Data

(60) Provisional application No. 60/467,706, filed on May 2, 2003.

(51) Int. Cl.
    *H01C 7/10*        (2006.01)
(52) U.S. Cl. .............................. 338/22 R; 338/22 SD; 338/329
(58) Field of Classification Search .............. 338/22 R, 338/22 SD, 326, 329; 361/106
    See application file for complete search history.

(56) References Cited

U.S. PATENT DOCUMENTS

| | | | |
|---|---|---|---|
| 3,793,604 A * | 2/1974 | Duggan et al. ........... | 338/22 R |
| 4,210,800 A * | 7/1980 | Van Bokestal et al. ..... | 219/544 |
| 4,237,441 A | 12/1980 | van Konynenburg et al. ......... | 338/22 R |
| 4,545,926 A | 10/1985 | Fouts et al. ................ | 252/511 |
| 4,685,025 A | 8/1987 | Carlomagno ................ | 361/106 |
| 4,689,475 A | 8/1987 | Kleiner et al. .............. | 219/553 |
| 4,724,417 A | 2/1988 | Au et al. ................... | 338/22 R |
| 4,774,024 A | 9/1988 | Deep et al. ................. | 252/511 |
| 4,800,253 A | 1/1989 | Kleiner et al. .............. | 219/553 |
| 4,935,156 A | 6/1990 | van Konynenburg et al. ........... | 219/553 |
| 4,937,551 A * | 6/1990 | Plasko ....................... | 338/22 R |
| 5,039,844 A * | 8/1991 | Nagahori .................... | 219/541 |
| 5,049,850 A | 9/1991 | Evans ....................... | 338/22 R |

(Continued)

FOREIGN PATENT DOCUMENTS

EP          0315700 A    5/1989

(Continued)

OTHER PUBLICATIONS

International Search Report for International Application No. PCT/US2004/013226, mailed Oct. 20, 2004.

*Primary Examiner*—Tu Hoang

(57) ABSTRACT

A circuit protection device (31) suitable for surface mounting on a substrate (19). The device has a laminar PTC resistive element (3) which is composed of a conductive polymer composition and is positioned between first and second electrodes (5,7). Attached to the first electrode is a first electrical terminal (33) containing an electrically conductive material which has a first attachment portion (35) connected to a first flexible portion (39) by means of a first connection portion (47). At least part of the first flexible portion is free of attachment to the first electrode. The first attachment portion is coplanar with at least one of the first connection portion and the first flexible portion. The first attachment portion may contain a slot (49) and a solid hinge portion (51). When the device is mounted on a substrate by means of a mounting component (41) extending from the first terminal, the first flexible portion allows contraction and expansion of the conductive polymer despite the rigid attachment of the mounting component onto the substrate.

20 Claims, 4 Drawing Sheets

U.S. PATENT DOCUMENTS

| | | | |
|---|---|---|---|
| 5,117,089 A * | 5/1992 | Honkomp et al. | 219/201 |
| 5,142,267 A * | 8/1992 | Fellner et al. | 338/23 |
| 5,250,228 A | 10/1993 | Baigrie et al. | 252/511 |
| 5,378,407 A | 1/1995 | Chandler et al. | 252/513 |
| 5,436,609 A * | 7/1995 | Chan et al. | 338/22 R |
| 5,451,919 A | 9/1995 | Chu et al. | 338/22 R |
| 5,451,921 A * | 9/1995 | Crawford et al. | 338/220 |
| 5,582,770 A | 12/1996 | Chu et al. | 252/511 |
| 5,726,623 A * | 3/1998 | Camp | 338/22 R |
| 5,747,147 A | 5/1998 | Wartenberg et al. | 428/209 |
| 6,130,597 A | 10/2000 | Toth et al. | 338/22 R |
| 6,358,438 B1 | 3/2002 | Isozaki et al. | 252/511 |
| 6,362,721 B1 | 3/2002 | Chen et al. | 338/22 R |
| 6,570,483 B1 | 5/2003 | Chandler et al. | 338/22 R |
| 2002/0011918 A1 * | 1/2002 | Miyazaki et al. | 338/22 R |
| 2002/0089408 A1 | 7/2002 | Walsh et al. | 338/22 R |
| 2002/0175801 A1 * | 11/2002 | Katsuki et al. | 338/22 R |
| 2004/0113749 A1 * | 6/2004 | Schrank et al. | 338/25 |

FOREIGN PATENT DOCUMENTS

| | | |
|---|---|---|
| WO | WO98/44516 A | 10/1998 |
| WO | WO00/74081 A | 12/2000 |

\* cited by examiner

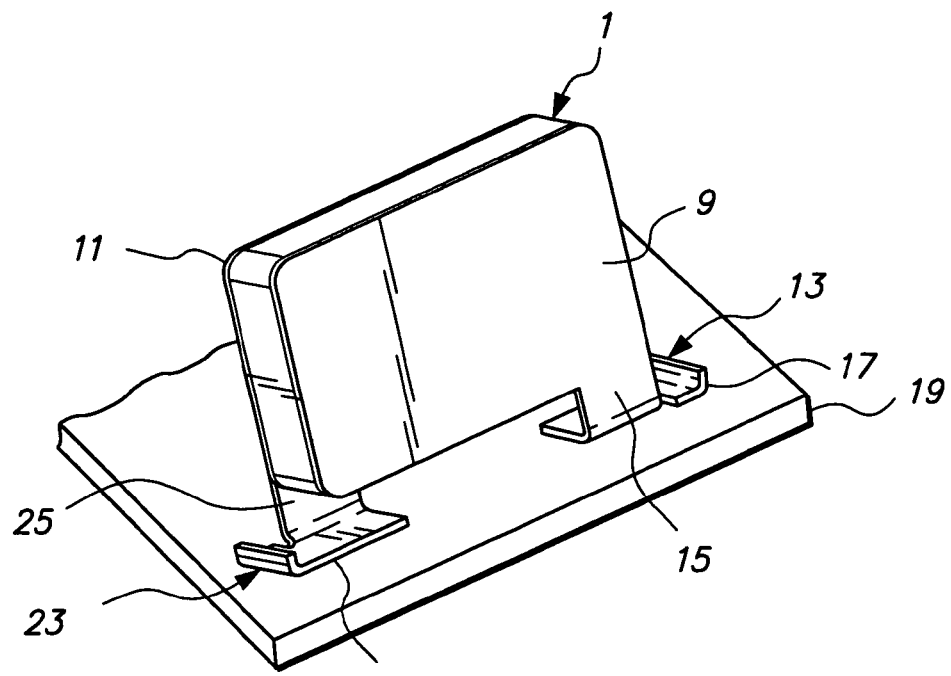
FIG. 1
PRIOR ART
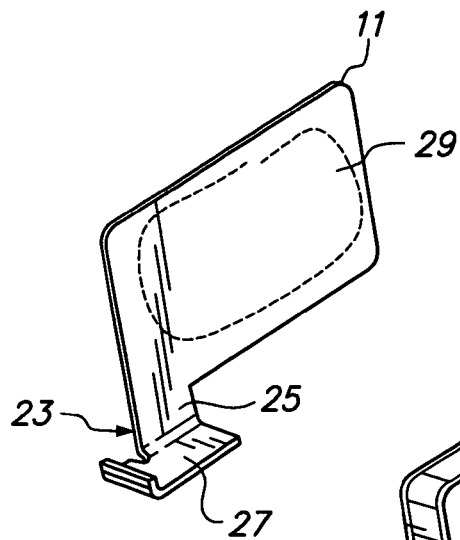
FIG. 2A
PRIOR ART
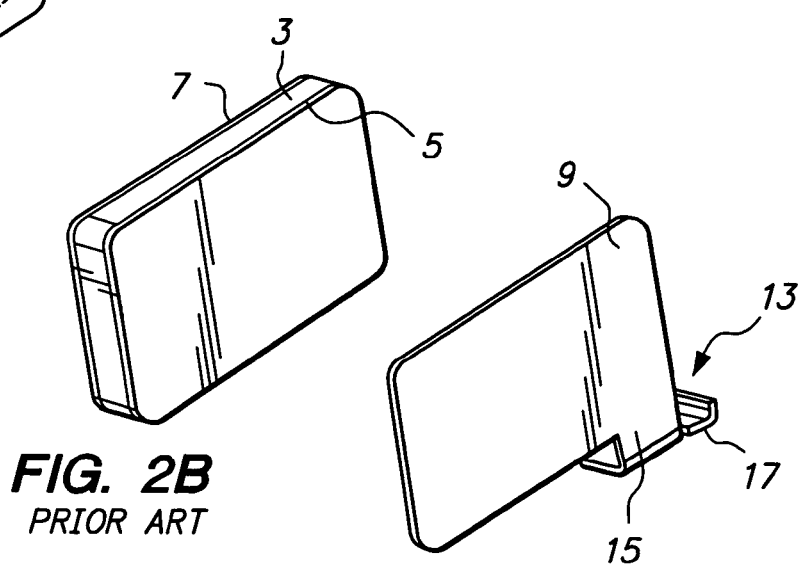
FIG. 2B
PRIOR ART
FIG. 2C
PRIOR ART

CIRCUIT PROTECTION DEVICE

CROSS-REFERENCE TO RELATED APPLICATIONS

This application is an application under 35 USC 111(a) and claims priority under 35 USC 119 from Provisional Application Serial No. 60/467,706, filed May 2, 2003, under 35 USC 111(b). The disclosure of that provisional application is incorporated herein by reference.

BACKGROUND OF THE INVENTION

1. Field of the Invention

This invention relates to circuit protection devices suitable for surface mounting onto a substrate, and to assemblies of such devices.

2. Introduction to the Invention

Circuit protection devices which exhibit positive temperature coefficient of resistance (PTC) behavior are well known. Due to this PTC behavior the resistance increases anomalously from a low resistance, low temperature state to a high resistance, high temperature state at a particular temperature, i.e. the switching temperature $T_s$. Under normal operating conditions, a circuit protection device which is placed in series with a load in an electrical circuit has a relatively low resistance and low temperature. If, however, a fault occurs, e.g. due to excessive current in the circuit or a condition which induces excessive heat generation within the device, the device "trips", i.e. is converted to its high resistance, high temperature state. As a result, the current in the circuit is dramatically reduced and other components are protected. When the fault condition and the power are removed, the device resets, i.e. returns to its low resistance, low temperature condition. Fault conditions may be the result of a short circuit, the introduction of additional power to the circuit, power surges, or overheating of the device by an external heat source, among other reasons.

Preferred circuit protection devices comprise a conductive polymer composition, i.e. a composition comprising a polymeric component, and, dispersed in that component, a particulate conductive filler. Preferably the polymeric component comprises a crystalline polymer. During the tripping event the device expands as the crystallites in the polymer melt. It is known that for optimum performance, expansion of the polymer should not be significantly restricted or otherwise the PTC anomaly will be diminished. Therefore, attachment of electrodes, e.g. metal foils, to a PTC element must be carefully done. Additional restriction may occur if the mounting of the device, e.g. onto or through a substrate such as a printed circuit board, results in a restraining force either when the polymer expands or contracts. In order to avoid substantial restriction, conventional radial leaded devices, in which wire leads are attached to metal foil electrodes sandwiching a PTC element, often contain "kinks" or other non-rigid sections as part of the leads. This means that, although the end of the lead that is in contact with the substrate may be rigidly restrained, the non-rigid section allows expansion and contraction to occur. See, for example, U.S. Pat. No. 4,685,025 (Carlomagno), the disclosure of which is incorporated herein by reference.

Surface mount devices, which are attached directly to the surface of the substrate, may also suffer from restraining forces. For example, if the device is positioned parallel to the surface of the printed circuit board or substrate and has a configuration in which a top and/or bottom lead (often in the form of a metal "strap") is soldered or welded onto the substrate, the lead(s) should be positioned so that they do not restrict expansion. This can be achieved by making the top lead sufficiently long or flexible so that any restraining forces are minimized.

BRIEF SUMMARY OF THE INVENTION

For some applications in which a device is exposed to relatively high voltages, e.g. 60 volts or greater, and a relatively small footprint on the substrate is desired, it is preferred to surface-mount the device in a position perpendicular to a substrate. These devices are constructed with a PTC resistive element sandwiched between two metal foil electrodes, and then the electrodes are in contact with a lead frame or terminal which is itself attached to the substrate by means of a mounting component comprising a solderable pad or other element which is often in the shape of a "foot" which extends from a tab or "leg" from the terminal. If the lead frame or terminal is rigidly mounted, then restraining forces are conveyed to the PTC element and expansion and/or contraction of the polymer may be restricted. Devices of this type are often used for telecommunications applications.

We have now found that improved performance under high voltage conditions can be achieved for surface-mount devices when the lead frame or terminal attached to one or both of the metal foil electrodes comprises a flexible section. This flexible portion, which overlaps at least part of the resistive element, effectively extends the length of the "leg", providing freedom to bend or move in response to expansion and contraction of the device.

Therefore, in a first aspect this invention provides a circuit protection device suitable for surface mounting on a substrate, comprising
 (1) a laminar PTC resistive element which
    (a) is composed of a conductive polymer composition,
    (b) has a first major surface having a first surface area and second major surface having a second surface area, and
    (c) has a periphery;
 (2) a first electrode attached to the first surface of the PTC element;
 (3) a second electrode attached to the second surface of the PTC element; and
 (4) a first electrical terminal comprising an electrically conductive material, having a first periphery and a first surface area, and comprising
    (a) a first attachment portion (i) having an attachment surface with a first surface area, and (ii) at least part of which is attached to the first electrode,
    (b) a first flexible portion (i) which is connected to the first attachment portion, (ii) at least a part of which is free of attachment to the first electrode, (iii) at least part of which lies within the periphery of the resistive element, and (iv) has a first surface area, and
    (c) a first connection portion which connects the first attachment portion and the first flexible portion,
    the first attachment portion being substantially coplanar with at least one of the first flexible portion and the first connection portion.

Devices of the invention are generally mounted onto a substrate to form an assembly. Therefore, in a second aspect, this invention provides an assembly comprising
 (A) a circuit protection device comprising
    (1) a laminar PTC resistive element which
       (a) is composed of a conductive polymer composition, (b) has a first major surface having a first surface area and second major surface having a second surface area, and
(c) has a periphery;
(2) a first electrode attached to the first surface of the PTC element;
(3) a second electrode attached to the second surface of the PTC element; and
(4) a first electrical terminal comprising an electrically conductive material, having a first periphery, and comprising
   (a) a first attachment portion (i) having an attachment surface with a first surface area, and (ii) at least part of which is attached to the first electrode, and
   (b) a first flexible portion (i) which is connected to the first attachment portion, (ii) at least a part of which is free of attachment to the first electrode, (iii) at least part of which lies within the periphery of the resistive element and part of which extends beyond the periphery of the resistive element, and (iv) comprises a first mounting component in the portion extending beyond the periphery,
   (c) a first connection portion which connects the first attachment portion and the first flexible portion the first attachment portion being substantially coplanar with at least one of the first flexible portion and the first connection portion; and
(5) a second electrical terminal comprising an electrically conductive material, having a second periphery, and comprising
   (a) a second attachment portion having an attachment surface with a second surface area, at least part of which is attached to the second electrode, and
   (b) a portion which extends beyond the periphery of the resistive element, and comprises a second mounting component in the portion extending beyond the periphery; and
(B) a printed circuit board onto which the device is mounted by means of the first and second mounting components.

BRIEF DESCRIPTION OF THE DRAWINGS

The invention is illustrated by the drawings in which
FIG. 1 shows a perspective view of a conventional circuit protection device,
and
FIGS. 2a–2c show the device of FIG. 1 in an exploded perspective view.

DETAILED DESCRIPTION OF THE INVENTION

Figure 3:
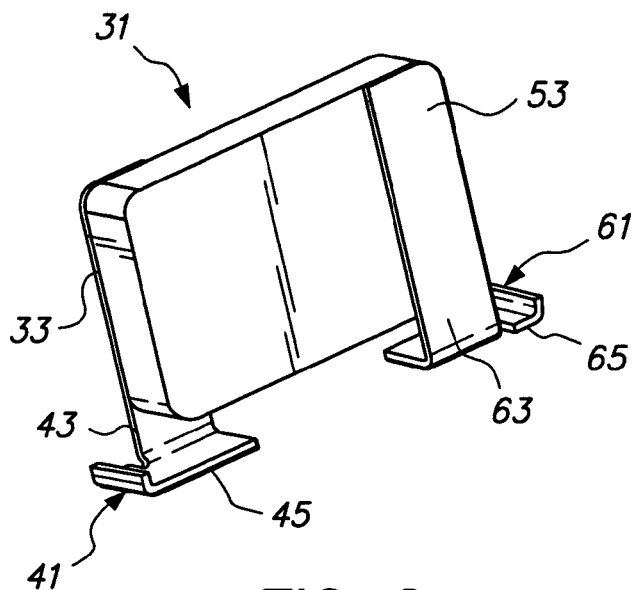
FIGS. 3 and 4a–4c show perspective and exploded perspective views of a circuit protection device of the invention.

The circuit protection device of the invention comprises a laminar PTC resistive element composed of a conductive polymer composition which exhibits PTC behavior. The conductive polymer composition comprises a polymeric component, and dispersed therein, a particulate conductive filler. The polymeric component comprises one or more polymers, one of which is preferably a crystalline polymer having a crystallinity of at least 10% as measured in its unfilled state by a differential scanning calorimeter. Suitable crystalline polymers include polymers of one or more olefins, particularly polyethylene such as high density polyethylene; copolymers of at least one olefin and at least one monomer copolymerisable therewith such as ethylene/acrylic acid, ethylene/ethyl acrylate, ethylene/vinyl acetate, and ethylene/butyl acrylate copolymers; melt-shapeable fluoropolymers such as polyvinylidene fluoride (PVDF) and ethylene/tetrafluoroethylene copolymers (ETFE, including terpolymers); and blends of two or more such polymers. For some applications it may be desirable to blend one crystalline polymer with another polymer, e.g. an elastomer or an amorphous thermoplastic polymer, in order to achieve specific physical or thermal properties, e.g. flexibility or maximum exposure temperature. The polymeric component generally comprises 40 to 90% by volume, preferably 45 to 80% by volume, especially 50 to 75% by volume of the total volume of the composition.

The particulate conductive filler which is dispersed in the polymeric component may be any suitable material, including carbon black, graphite, metal, metal oxide, conductive coated glass or ceramic beads, particulate conductive polymer, or a combination of these. The filler may be in the form of powder, beads, flakes, fibers, or any other suitable shape. The quantity of conductive filler needed is based on the required resistivity of the composition and the resistivity of the conductive filler itself. For many compositions the conductive filler comprises 10 to 60% by volume, preferably 20 to 55% by volume, especially 25 to 50% by volume of the total volume of the composition.

The conductive polymer composition may comprise additional components, such as antioxidants, inert fillers, non-conductive fillers, radiation crosslinking agents (often referred to as prorads or crosslinking enhancers, e.g. triallyl isocyanurate), stabilizers, dispersing agents, coupling agents, acid scavengers (e.g. $CaCO_3$), or other components. These components generally comprise at most 20% by volume of the total composition.

The conductive polymer composition exhibits positive temperature coefficient (PTC) behavior, i.e. it shows a sharp increase in resistivity with temperature over a relatively small temperature range. In this application, the term "PTC" is used to mean a composition which has an $R_{14}$ value of at least 2.5 and/or an $R_{100}$ value of at least 10, and it is preferred that the composition should have an $R_{30}$ value of at least 6, where $R_{14}$ is the ratio of the resistivities at the end and the beginning of a 14° C. range, $R_{100}$ is the ratio of the resistivities at the end and the beginning of a 100° C. range, and $R_{30}$ is the ratio of the resistivities at the end and the beginning of a 30° C. range. Generally the compositions used in devices of the invention show increases in resistivity which are much greater than those minimum values.

Suitable conductive polymer compositions for use in devices of the invention are disclosed in U.S. Pat. Nos. 4,237,441 (van Konynenburg et al.), 4,545,926 (Fouts et al.), 4,724,417 (Au et al.), 4,774,024 (Deep et al.), 4,935,156 (van Konynenburg et al.), 5,049,850 (Evans et al.), 5,250,228 (Baigrie et al.), 5,378,407 (Chandler et al.), 5,451,919 (Chu et al.), 5,582,770 (Chu et al.), 5,747,147 (Wartenberg et al.), 6,130,597 (Toth et al.), 6,358,438 (Isozaki et al.), and 6,362,721 (Chen et al.). The disclosure of each of these patents is incorporated herein by reference. Particularly preferred are compositions intended for high voltage applications, including those disclosed in U.S. Pat. Nos. 4,724,417 (Au et al.), 4,774,024 (Deep et al.), and 5,049,850 (Evans et al.).

The conductive polymer is in the form of a laminar PTC resistive element having first and second parallel major surfaces, the first major surface having a first surface area and the second major surface having a second surface area. The element is preferably sandwiched between first and second metal electrodes, the first of which is attached to the first surface of the PTC element and the second of which is attached to the second major surface. Preferably, the electrodes are in the form of metal foils, although a conductive ink, or a metal layer which has been applied by plating or other means can be used. Particularly suitable foil electrodes are microrough metal foil electrodes, including electrode-posited nickel and nickel-copper foils, in particular as disclosed in U.S. Pat. No. 4,689,475 (Matthiesen), U.S. Pat. No. 4,800,253 (Kleiner et al.), and U.S. Pat. No. 6,570,483 (Chandler et al.), the disclosure of each of which is incorporated herein by reference.

The PTC element has a thickness which is generally 1 to 2.5 mm (0.040 to 0.100 inch), as measured between the first and second electrodes. This is a thickness range which is particularly suitable for use in high voltage, e.g. 250 or 600 volt, applications. The element also has a periphery of generally 20 to 50 mm (0.79 to 1.97 inch). This periphery is measured in the plane parallel to the plane of the electrodes, and is the smaller of (1) the smallest circumference around the device and (2) the circumference measured at a distance halfway between the first and second electrodes. The measurement of the periphery preferably includes any noticeable depressions, cracks, or inclusions.

Connected to the first electrode is a first electrical terminal. The first terminal is composed of an electrically conductive material, e.g. brass, tin-plated brass, nickel, copper, or nickel-plated copper. It serves to provide a means for mounting the device in a position that is perpendicular to the substrate, and also may influence the electrical characteristics, e.g. the time to trip into the high resistance state, if it has different thermal characteristics from the conductive polymer and/or electrodes. The first terminal has a first periphery and a first surface area, and in some embodiments has a shape that is generally the same as that of the PTC element, with the addition of a extended portion for use in mounting. The first terminal has a first attachment portion which has an attachment surface with a first surface area. At least part of the first attachment portion is physically and electrically attached to the first electrode. In addition, the first terminal has a first flexible portion which has a first surface area and is connected to the attachment portion. At least a part of the flexible portion, and preferably all of the flexible portion, is free of attachment to the first electrode. At least part of the flexible portion lies within the periphery of the resistive element. This is in contrast to most conventional surface mount devices in which the straps or leads are attached, e.g. by solder, over the entire section of overlap with the resistive element, before extending beyond the periphery of the resistive element. The surface area of the first flexible portion comprises at least 10%, preferably at least 15%, particularly at least 20% of the surface area of the first terminal, although this varies depending on the specific shape of the first terminal.

The first attachment portion of the first terminal can be attached to the first electrode by means of an attachment material, for example solder, solder paste, conductive adhesive, conductive epoxy, or other appropriate material, or it may be welded or riveted or otherwise attached. It is preferred that the surface area of the first electrode be greater than the surface area of the attachment surface.

The first attachment portion and the first flexible portion are connected to one another by means of a first connection portion, which may be a specific region or a notional segment between the portions. Prior to installation (e.g., on a circuit board), the attachment portion is substantially coplanar with the connection portion or with the flexible portion. The most streamlined device is achieved when all three portions are substantially coplanar. However, the connection portion may be bent, e.g. in a U-shape, or otherwise moved out of the plane of the attachment portion, leaving the attachment and flexible portions substantially coplanar, or the flexible portion may be somewhat out of the plane of the attachment and connection portions.

In one embodiment, the connection portion comprises a slot, e.g. a generally rectangular slot, and a solid portion. The slot is cut into the terminal from one end, so as to separate the attachment portion from the flexible portion. The solid portion at the end of the slot acts as a hinge point, allowing the flexible portion the freedom to move. In another embodiment, the slot is in the form of a "U" with the open section of the "U" facing the attachment portion. Either type of slot can be beneficial in preventing the flow of solder or other attachment material from the attachment portion to the flexible portion by acting as a barrier. The attachment and flexible portions are often designed to be specific and separate sections, e.g. when separated by a physical connection portion. However, as indicated above, the connection portion may be a notional segment, and, in the event that some attachment material does contact a region originally intended to be part of the flexible portion, the actual flexible portion may be smaller than the original design.

In some embodiments, in order to minimize chances of the flexible portion becoming restrained due to direct attachment to the electrode, part or all of the flexible portion facing the electrode may comprise a material which makes attachment difficult, i.e. a nonattachment material. This nonattachment material may comprise a nonsolderable material, e.g. stainless steel, which will not bond to solder, or a paint, e.g. a polytetrafluoroethylene paint, that enhances the slipperiness of the surface. It is important that any such attachment minimizing section and nonattachment material not be present on the mounting pad in order to avoid interference with the solder reflow process (or other attachment method) commonly used for attachment of the device to the substrate.

It is preferred that the flexible portion extend beyond the periphery of the resistive element and that the portion extending beyond the periphery comprise a mounting component which can be attached onto the substrate.

It is preferred that the device also include a second electrical terminal, which may be the same as or different from the first electrical terminal in terms of shape and composition. For ease of installation onto a substrate, it may be preferred to have the first and second terminals be similar, i.e. both have an attachment portion and a flexible portion. However, depending on the application and the mounting method, the use of one terminal having a flexible portion and one without a flexible portion may provide adequate protection against restriction of expansion and contraction of the polymer. Regardless of the shape, the second electrical terminal is also composed of an electrically conductive material, it has a second periphery, and it comprises a second attachment portion. The said second attachment portion has an attachment surface with a second surface area, and at least part of the second attachment portion is attached to the second electrode. The second terminal may further comprise a second flexible portion that has a second surface area, is connected to the second attachment portion bymeans of a second connection portion, and is free of attachment to the second electrode. At least part of the second flexible portion lies within the periphery of the resistive element. Regardless of whether the second terminal has a second flexible portion, the second terminal also generally has a portion that extends beyond the periphery of the resistive element and contains a mounting component. If both the first and second terminals comprise a flexible portion, the shapes of the flexible portions may be the same or different.

In some embodiments, an insulating layer which conforms to at least part of the periphery of the PTC element may be present. Preferably, the insulating layer conforms to at least 10% of the thickness around the periphery of the PTC element, particularly at least 30% of the thickness, especially at least 50% of the thickness, more especially at least 70% of the thickness. In some embodiments it is preferred that the first insulating layer conform to substantially all of the thickness around the periphery of the PTC element, wherein "substantially all" means at least 90% is covered by the first insulating layer. In some embodiments, the first insulating layer is substantially free of contact with the first and second electrodes, and preferably is totally free of contact with the first and second electrodes, wherein "substantially free" means that at most only 10% of the total surface area of the first and second electrodes is covered by the first insulating layer. The insulating layer may comprise any conformable coating material, but is preferably polymeric. Suitable materials include polyethylenes, ethylene copolymers, fluoropolymers, polyesters, silicones, elastomers, rubbers, hot-melt adhesives, mastics, and gels. It is important that the layer conform and adhere to the conductive polymer composition of the PTC element, and that it maintain its conformance and adhesion during expansion of the conductive polymer during operation. The first insulating layer may be applied by any appropriate technique, e.g. it may be painted or sprayed on, or applied by pressure or melting, or applied by dip-coating. In some embodiments, the entire device, including the periphery of the PTC element and most or all of one or both terminals, can be coated with an insulating layer, so long as a sufficient area of the terminal(s) is left uncoated so that attachment to the substrate is still possible.

In addition to, or in place of, an insulating layer in contact with the exposed conductive polymer composition, the circuit protection device may also comprise an external insulation, e.g. a box or other enclosure to provide environmental and electrical protection.

The invention also includes an assembly in which a circuit protection device of the invention is mounted on a substrate, e.g. a printed circuit board. For some applications it is particularly preferred that two circuit protection devices be packaged together in one package prior to mounting on the substrate. These devices may be the same or different, and are often of use in telecommunications applications in which one device is used to protect the tip and the other the ring of the circuit.

The invention is illustrated by the drawings in which FIG. 1 shows a perspective view of conventional circuit protection device 1, and FIGS. 2a to 2c show device 1 in exploded view. PTC element 3 is sandwiched between first and second metal foil electrodes 5,7 to form a chip. First electrical terminal 9 is attached by solder paste (not shown) to first electrode 5, and second electrical terminal 11 is attached to second electrode 7 by solder paste in region 29 across the majority of the surface area of second terminal 11. First terminal 9 is attached to substrate 19, e.g. a printed circuit board, using first mounting component 13, which includes a first extended section 15, which extends from the perimeter of the chip, and a first mounting pad 17 which can be solder-reflowed or otherwise attached to substrate 19. Second terminal 11 has a second mounting component 23, which includes second extended section 25 and second mounting pad 27.

Figure 4A:
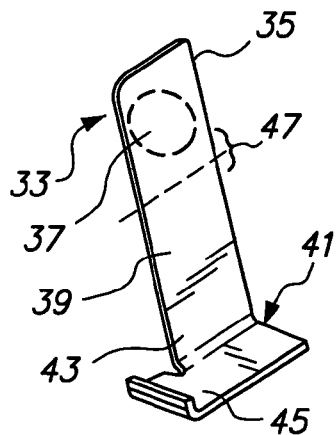
Figure 4B:
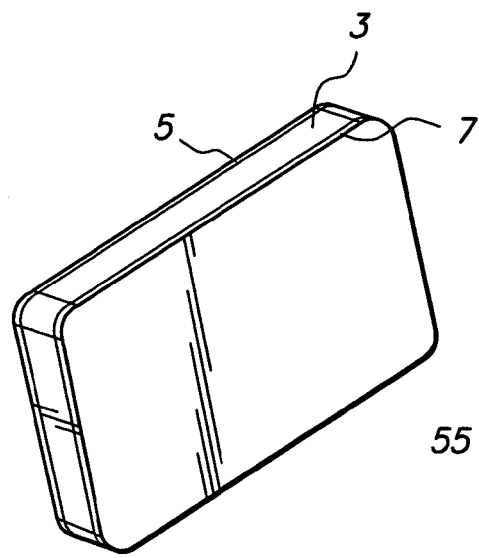
Figure 4C:
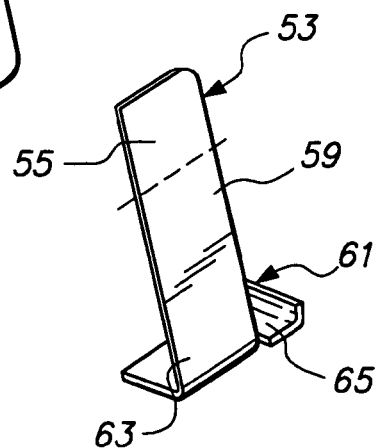
Figure 5:
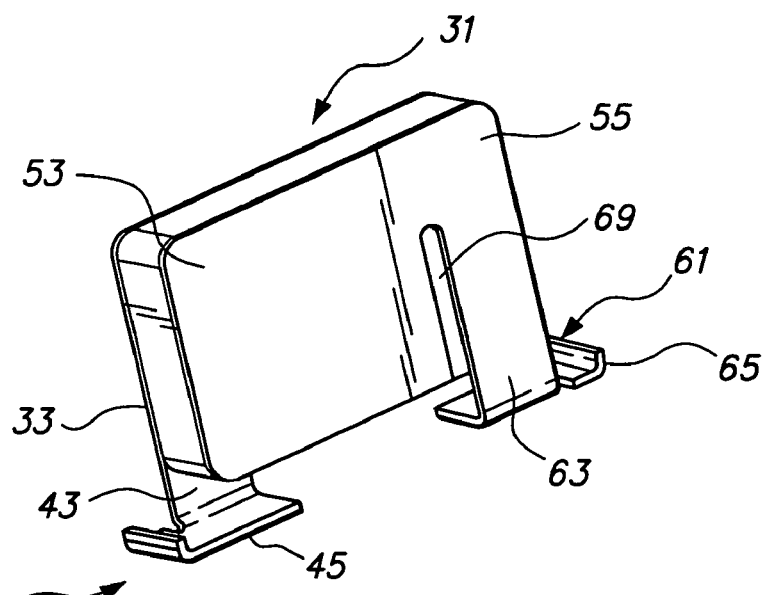
FIGS. 5 and 6a–6c show perspective and exploded perspective views of another circuit protection device of the invention.

An embodiment of the invention is shown in FIGS. 3 and 4a to 4c, which are perspective and exploded perspective views of circuit protection device 31. A PTC chip as shown in FIG. 4b is attached to first electrical terminal 33 (FIG. 4a) which contains first attachment portion 35 having first attachment surface 37, and first flexible portion 39 which is notionally separated from first attachment portion 35 by means of connection portion 47. Extending from the end of first flexible portion 39 is first mounting component 41 comprising first extended section 43 and first mounting pad 45. Second terminal 53 (FIG. 4c), which in this embodiment is identical to first terminal 33, is attached via second attachment portion 55 and second attachment surface (not shown) to second electrode 7. Second flexible portion 59 has extending from its end second mounting component 61 comprising second extended section 63 and second mounting pad 65.

Figure 6A:
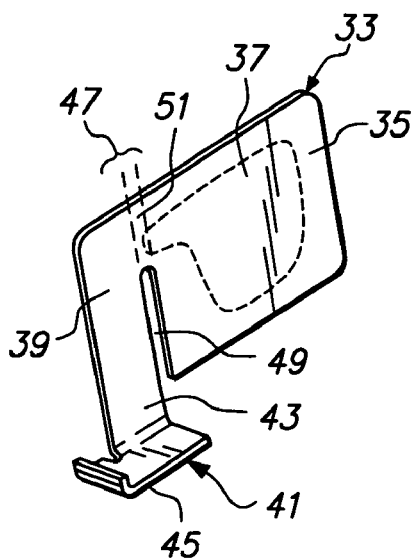
Figure 6B:
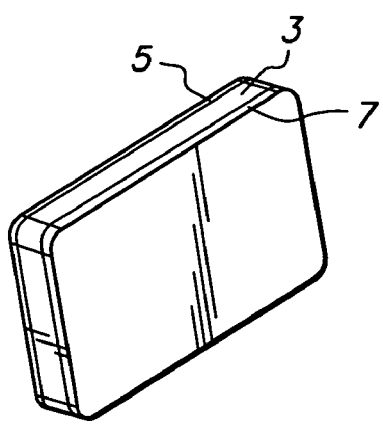
Figure 6C:
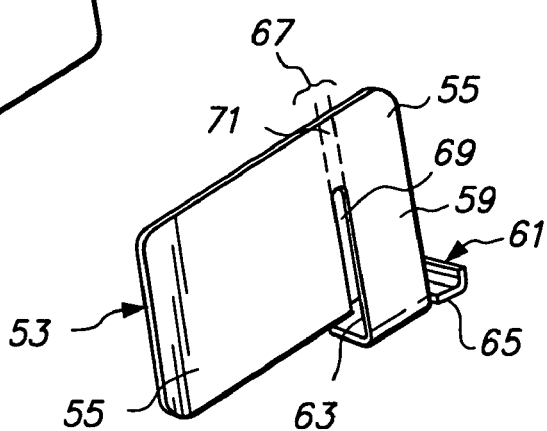
Figure 7:
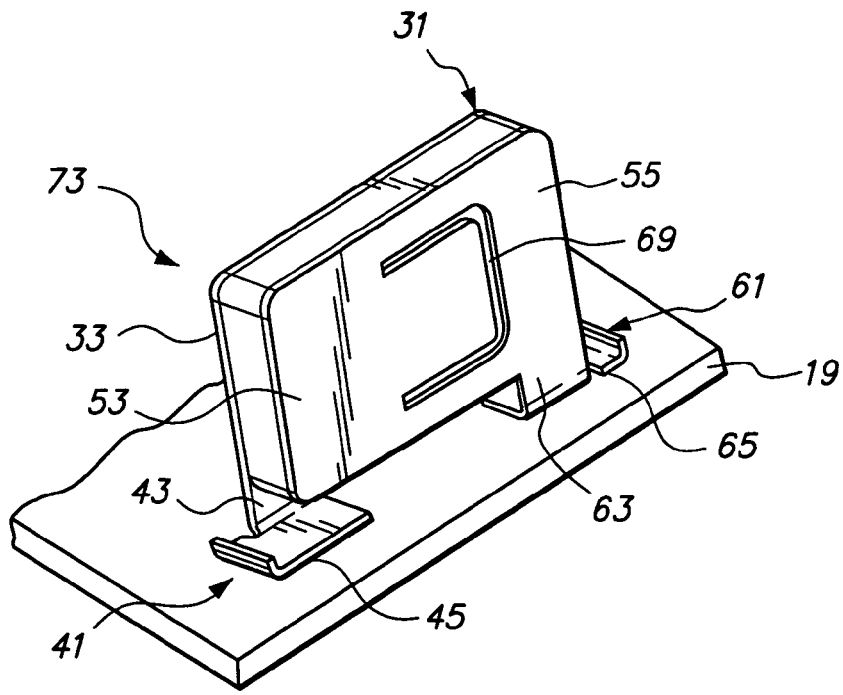
FIG. 7 shows a perspective view of an assembly of the invention and
FIGS. 8a–8c show exploded perspective views of an additional circuit protection device of the invention.
Figure 8A:
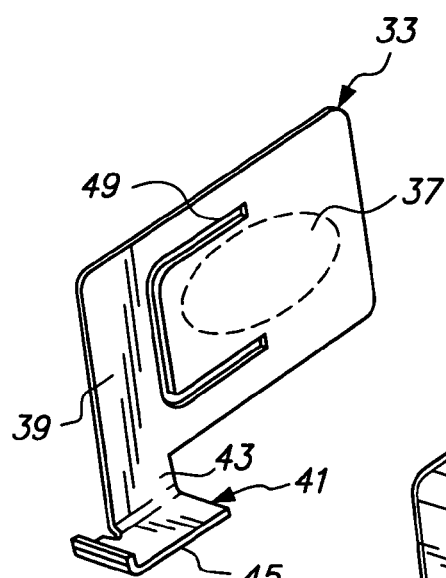
Figure 8B:
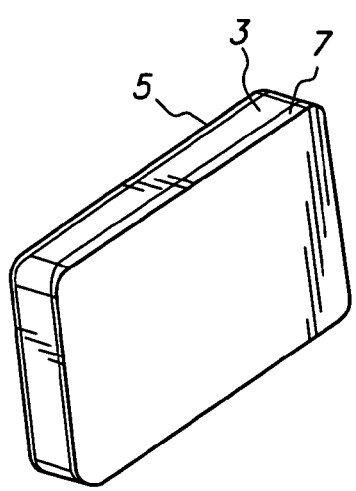
Figure 8C:
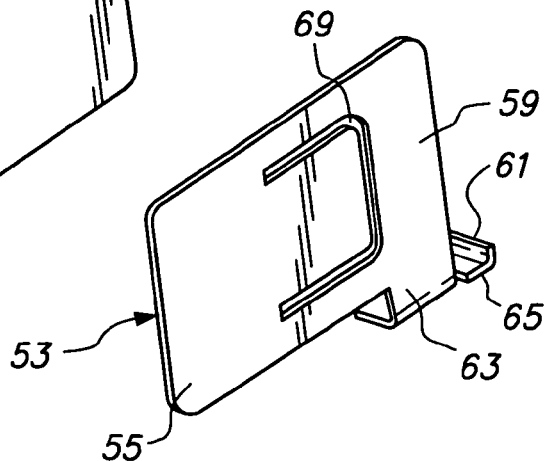

FIGS. 5 and 6a to 6c, and FIGS. 8a to 8c, show perspective and exploded perspective views of two additional embodiments of circuit protection device 31. FIG. 7 shows a perspective view of device 31 of FIGS. 8a to 8c mounted on substrate 19 to form assembly 73. In FIGS. 6a and 6c, first connection portion 47 comprises first slot 49 and first solid hinge portion 51, while second connection portion 67 comprises second slot 69 and second solid hinge portion 71. In the embodiment of FIG. 7, the connection portion comprises a U-shaped slot.

The invention is illustrated by the following examples, in which Example 1 is a comparative example.

EXAMPLE 1 (COMPARATIVE)

A conductive polymer composition was prepared by mixing 37.1% by weight high density polyethylene (Petrothene™ LB832, available from Equistar), 38% by weight carbon black (Raven™ 430, available from Columbian Chemicals), and 24.9% by weight magnesium hydroxide (Kisuma™ 5A, available from Kisuma) to form pellets. The composition was extruded into a 2.0 mm (0.080 inch) thick sheet, which was laminated between two sheets of 0.0025 cm (0.001 inch) thick electrodeposited nickel/copper foil (available from Fukuda). Chips with dimensions of 8.3×13.5 mm (0.328×0.533 inch) were cut from the plaque. The chips were heat-treated and irradiated with an electron beam to a total of 100 Mrads. The exposed conductive polymer at the edges of the chips was then coated with polyester. Stamped tin-plated brass terminals having a generally rectangular shape of approximately 8.4×13.6 mm (0.330×0.535 inch) and an extended tab for mounting (as shown in FIGS. 2a and 2c) were attached to the foil electrodes for each device by using 60:40 tin/lead solder paste. The resulting devices had an average resistance of about 3.5 ohms.

Ninety-nine devices were then tested in a power cross test, similar to the Bellcore/Telcordia GR1089-CORE test, as follows. A device was inserted into a circuit in series with a switch, a 600 volt 60 Hz AC power source, a 1.6 A line simulator fuse, and a fixed resistor (approximately 10 ohms) which provided 60 A in a short circuit condition. The test consisted of closing the switch, thus tripping the device, and maintaining the switch closed for 5 seconds. The switch was then opened and the device allowed to cool for 125 seconds. The device was deemed to pass the test if the line simulator fuse did not open and the device continued to be operational. Eighty-nine percent of the devices survived the test.

EXAMPLE 2

Devices were prepared and tested according to Example 1, except that the terminals that were attached to the metal foil electrodes had the shape shown in FIGS. 6a and 6c. The slot cut into the terminal had dimensions of approximately 1.0×5.54 mm (0.040×0.218 inch), and was positioned approximately 3.0 mm (0.118 inch) from the edge of the terminal. The resulting device had a flexible section in the vicinity of the mounting component. The devices had an average resistance of about 3.5 ohms. The test results showed that ninety-seven percent of these devices survived the test, performing significantly better than the conventional devices.

It will be understood that the above-described arrangements of apparatus are merely illustrative of applications of the principles of this invention and many other embodiments and modifications may be made without departing from the spirit and scope of the invention as defined in the claims.

What is claimed is:

1. A circuit protection device suitable for surface mounting on a substrate, comprising
   (1) a laminar PTC resistive element which
      (a) is composed of a conductive polymer composition,
      (b) has a first major surface having a first surface area and second major surface having a second surface area, and
      (c) has a periphery;
   (2) a first electrode attached to the first surface of the PTC element;
   (3) a second electrode attached to the second surface of the PTC element; and
   (4) a first electrical terminal comprising an electrically conductive material, having a first periphery and a first surface area, and comprising
      (a) a first attachment portion (i) having an attachment surface with a first surface area, and (ii) at least part of which is attached to the first electrode,
      (b) a first flexible portion (i) which is connected to the first attachment portion, (ii) at least a part of which is free of attachment to the first electrode, (iii) at least part of which lies within the periphery of the resistive element, and (iv) which has a first surface area, and
      (c) a first connection portion which connects the first attachment portion and the first flexible portion, the first attachment portion being substantially coplanar with both the first flexible portion and the first connection portion prior to installation on the substrate.

2. A device according to claim 1 wherein all of the first flexible portion is free of attachment to the first electrode.

3. A device according to claim 1 wherein the surface area of the first flexible portion comprises at least 10% of the surface area of the first terminal.

4. A device according to claim 1 wherein the connection portion comprises a slot and a solid portion.

5. A device according to claim 4 wherein the slot comprises a generally rectangular shape.

6. A device according to claim 4 wherein the slot comprises a U-shape.

7. A device according to claim 1 wherein attachment of the first attachment portion to the first electrode is by means of an attachment material.

8. A device according to claim 7 wherein the attachment material comprises solder, solder paste, conductive adhesive, or a conductive epoxy.

9. A device according to claim 1 wherein attachment of the first attachment portion to the first electrode is by means of a weld.

10. A device according to claim 1 wherein the surface area of the first electrode is greater than the surface area of the attachment surface.

11. A device according to claim 1 wherein the flexible portion extends beyond the periphery of the resistive element.

12. A device according to claim 11 wherein the flexible portion comprises a first mounting component in the portion extending beyond the periphery.

13. A device according to claim 1 wherein the flexible portion comprises a section facing the electrode which comprises a nonattachment material.

14. A device according to claim 1 which further comprises
   (5) a second electrical terminal comprising an electrically conductive material, having a second periphery, and comprising a second attachment portion, said second attachment portion (i) having an attachment surface having a second surface area, and (ii) at least part of which is attached to the second electrode.

15. A device according to claim 14 wherein the second terminal further comprises a second flexible portion (i) which is connected to the second attachment portion, (ii) at least a part of which is free of attachment to the second electrode, (iii) at least part of which lies within the periphery of the resistive element, and (iv) which has a second surface area.

16. A device according to claim 14 wherein the first and second terminals have a similar shape.

17. A device according to claim 1 wherein the first periphery of the first terminal is greater than the periphery of the resistive element.

18. An assembly comprising
   (A) a circuit protection device comprising
      (1) a laminar PTC resistive element which
         (a) is composed of a conductive polymer composition,
         (b) has a first major surface having a first surface area and second major surface having a second surface area, and
         (c) has a periphery;
      (2) a first electrode attached to the first surface of the PTC element;
      (3) a second electrode attached to the second surface of the PTC element; and
      (4) a first electrical terminal comprising an electrically conductive material, having a first periphery, and comprising
         (a) a first attachment portion (i) having an attachment surface with a first surface area, and (ii) at least part of which is attached to the first electrode, and
         (b) a first flexible portion (i) which is connected to the first attachment portion, (ii) at least a part of which is free of attachment to the first electrode, (iii) at least part of which lies within the periphery of the resistive element and part of which extends beyond the periphery of the resistive element, and (iv) which comprises a first mounting component in the portion extending beyond the periphery, (c) a first connection portion which connects the first attachment portion and the first flexible portion the first attachment portion being substantially coplanar with both the first flexible portion and the first connection portion prior to mounting;

(5) a second electrical terminal comprising an electrically conductive material, having a second periphery, and comprising (a) a second attachment portion having an attachment surface with a second surface area, at least part of which is attached to the second electrode, and (b) a portion which extends beyond the periphery of the resistive element, and comprises a second mounting component in the portion extending beyond the periphery; and (B) a printed circuit board onto which the device is mounted by means of the first and second mounting components.

19. An assembly according to claim 18 wherein the second terminal further comprises a second flexible portion (i) which is connected to the second attachment portion by means of a second connection portion, (ii) at least a part of which is free of attachment to the second electrode, and (iii) which comprises the portion extending beyond the periphery of the resistive element which comprises the second mounting component.

20. An assembly according to claim 18 wherein the assembly comprises two circuit protection devices.

* * * * *